United States Patent
Chiu

(10) Patent No.: US 6,361,904 B1
(45) Date of Patent: Mar. 26, 2002

(54) METHOD FOR REPAIRING THE SHIFTER LAYER OF AN ALTERNATING PHASE SHIFT MASK

(75) Inventor: Ching-Shiun Chiu, Cheng-Kung (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/593,536

(22) Filed: Jun. 14, 2000

(51) Int. Cl.[7] .................................................. G03F 9/00
(52) U.S. Cl. ............................................................ 430/5
(58) Field of Search ........................ 430/5, 322; 716/19, 716/21; 250/492.21, 492.22; 204/192.1, 192.11

(56) References Cited

U.S. PATENT DOCUMENTS

| | | | |
|---|---|---|---|
| 5,272,024 A | 12/1993 | Lin | 430/5 |
| 5,384,219 A | 1/1995 | Dao et al. | 430/5 |
| 5,439,763 A | * 8/1995 | Shimase et al. | 430/5 |
| 5,443,931 A | 8/1995 | Watanabe | 430/5 |
| 5,554,465 A | 9/1996 | Watanabe | 430/5 |
| 5,582,939 A | 12/1996 | Pierrat | 430/5 |
| 5,795,685 A | 8/1998 | Liebmann et al. | 430/5 |
| 5,807,650 A | * 9/1998 | Komano et al. | 430/5 |
| 5,881,125 A | 3/1999 | Dao | 378/35 |
| 5,882,823 A | 3/1999 | Neary | 430/5 |
| 5,965,301 A | 10/1999 | Nara et al. | 430/5 |

* cited by examiner

Primary Examiner—S. Rosasco
(74) Attorney, Agent, or Firm—George O. Saile; Stephen B. Ackerman; William J. Stoffel

(57) ABSTRACT

A method for repairing shifter layer defects in a phase shifting mask. A two step process is used to form an equivalent shifter layer with about the same light transmittance and phase angle shift as an original, non-defective shifter layer. (Typically for a DUV APSM, transmittance is about 6% and phase angle shift is about 180 degrees.) The first step is to etch the quartz substrate in a focus ion beam repair machine, using $XeF_2$ gas, to cause a leading phase angle shift. The second step is to deposit an equivalent shifter layer in-situ in the focus ion beam repair machine, using a carbon based gas. When the equivalent shifter layer has about the same transmittance as the original shifter layer (e.g. 6%), the phase angle is lagging less than 180 degrees. The leading phase angle shift caused by etching the quartz substrate and the lagging phase angle caused by the equivalent shifter layer combine to produce a phase angle 180 degrees leading.

15 Claims, 3 Drawing Sheets

METHOD FOR REPAIRING THE SHIFTER LAYER OF AN ALTERNATING PHASE SHIFT MASK

BACKGROUND OF INVENTION

1) Field of the Invention

This invention relates generally to fabrication of a semiconductor device and more particularly to a method for repairing the shifter layer of an alternating phase shift mask (APSM) by creating an equivalent shifter film both in transmittance and in phase angle transformation.

2) Description of the Prior Art

Photolithography is a well known technique used to apply a pattern (such as a circuit pattern) onto the surface of a workpiece (such as semiconductor chip, wafer, or substrate), and which is also capable of producing very small, intricate patterns for many other applications. Traditional photolithography involves applying electromagnetic radiation through a transparent mask (such as quartz) having an opaque pattern (such as chrome) formed thereon such that the light or radiation passes through the transparent mask, but not through the opaque pattern. The opaque pattern is transferred to the semiconductor structure when the light (electromagnetic radiation) passes through the non opaque areas of the mask (openings) onto a photosensitive material (such as photoresist) which is applied to the surface of the semiconductor structure. The photosensitive material is exposed to a solution which dissolved those portions which have been exposed to light, leaving photosensitive material in the pattern from the mask. (Photosensitive materials are also available wherein the exposed areas remain and the unexposed areas are removed.)

A recent improvement in photolithography technique is the alternating phase shifting mask (APSM), wherein alternating areas of the mask which allow light transmission have a phase shifting layer applied thereon, such that the light is shifted out of phase from the adjacent area. The electromagnetic radiation that passes through the phase shifting openings interferes destructively with the electromagnetic radiation that passes through the non phase shifting openings. This destructive interference reduces pattern distortion caused by reflected and deflected electromagnetic radiation, providing improved resolution between exposed and unexposed areas.

Although APSMs provide significant resolution and/or dimensional control enhancements over traditional (binary) masks, they are often difficult or impossible to repair. This is because any repair to the phase shift layer (shifter layer) of an APSM must meet both the transmittance and phase angle transformation requirements of the damaged or missing shifter layer. Typical shifter layer defects include pinholes, missing shifter layer, or misplaced shifter layer. If the APSM can not be repaired it typically must be replaced in its entirety. Since the probability of fabricating a completely defect free APSM is low, especially for complex state-of-the-art circuits, unacceptable mask costs and delays can result.

Much effort has gone into solving this APSM defect problem. One method for repairing phase shift layer defects requires fabricating a separate repair mask for the defect area, thereby increasing the number of photolithography steps and masks required, resulting in increased processing cost and cycle time. Another method for repairing phase shift layer defects requires fabrication of an APSM with extra phase shift layers which cancel each other out if left in place, and which can be removed to repair missing shifter layers and pinholes. However, mask cost and cycle time is increased even for APSMs without shifter layer defects. Another problem with this method is that it may adversely affect the depth of focus. Also, this method requires greater control over shifter layer thickness to achieve the same phase shift accuracy since three shifter layers are used, and therefore three shifter layer errors, are incurred.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 5,795,685 (Liebmann et al.) show a method for repairing phase shifting masks by creating a second mask which contains phase shifters, removing the circuitry pattern from the defective areas of the first mask, and copying the circuitry pattern from the defective areas of the first mask onto the second mask.

U.S. Pat. No. 5,964,301 (Nara et al.) teaches a method for repairing a photomask using a chemical etch to remove a residual defect (opaque area in an area that is supposed to be clear). This invention does not address shifter layer defects.

U.S. Pat. No. 5,272,024 (Lin) shows a method of fabricating a repairable phase shifting mask and a method for repairing said mask. In this invention a stack of three phase shifting layers wherein the first and third layer have a phase shift, in radians, of θ (the desired phase shift) and the middle layer has a phase shift, in radians, of 2π−θ. Missing phase shifters, unwanted phase shifters and defective phase shifters can then be repaired by removing one or two layers depending upon whether the phase shifting status has to be retained or altered.

U.S. Pat. No. 5,582,939 (Pierrat) shows a method for fabricating a defect-free phase shifting mask using an etch stop layer under the phase shift layer wherein the etch stop layer is chemically different from the phase shift layer. Defects, such as bump defects in the phase shift area can be removed by etching using the etch stop layer to endpoint the etch process. This invention does not address missing shifter layer or shifter layer pinhole defects.

U.S. Pat. No. 5,384,219 (Dao et al.) discloses a method for making identical inverted phase shifted features.

U.S. Pat. No. 5,881,125 (Dao) shows an attenuated phase shifting reticle using sub-resolution pattern.

U.S. Pat. No. 5,882,823 (Neary) shows a method for repairing an alternating phase shifting mask with a pinhole defect by etching the shifter layer surrounding the defect and by etching the adjacent substrate using FIB sputtering to maintain the 180 degree phase shift between adjacent regions.

U.S. Pat. No. 5,554,465 (Watanabe) and U.S. Pat. No. 5,443,931 (Watanabe) disclose methods for repairing shifter defects using a polymer with a siloxane-bond structure.

SUMMARY OF THE INVENTION

It is an object of the present invention to provide a method for repairing shifter layer defects in an alternating phase shifting mask wherein the transmission and phase shift angle are equivalent to a normal phase shifting layer.

It is another object of the present invention to provide a method for repairing a shifter layer defect in an alternating phase shifting mask which does not require additional masks or a mask containing multiple phase shifting layers regardless of the presence or absence of shifter layer defects.

It is another object of the present invention to provide a method for repairing a shifter layer defect in an alternating phase shifting mask which provides a depth of focus comparable to a normal phase shifting layer.

It is yet another object of the present invention that the repair method according to the preceding objects can be applied to an attenuated phase shift mask, as well as an alternating phase shift mask.

To accomplish the above objectives, the present invention provides a method for repairing shifter layer defects such as a missing shifter layer or pin holes in a shifter layer by forming an equivalent shifter layer with the same transmittance, phase shift angle, and depth of focus as an original DUV APSM shifter layer. The key to this invention is a novel two step process to form an equivalent shifter layer with about the same light transmittance and phase angle shift as an original, non-defective shifter layer. For a DUV APSM, transmittance is typically about 6% and phase angle shift is about 180 degrees. The first step is to etch the quartz substrate in a focus ion beam repair machine, using $XeF_2$ gas, to cause a leading phase angle shift. The second step is to deposit an equivalent shifter layer in the focus ion beam repair machine, using a carbon-based gas. When the equivalent shifter layer has about the same transmittance as the original shifter layer (e.g. 6%), the phase angle is lagging less than 180 degrees. The leading phase angle shift caused by etching the quartz substrate and the lagging phase angle caused by the equivalent shifter layer combine to produce a phase angle 180 degrees leading.

The present invention provides considerable improvement over the prior art. The key advantages of the present invention are that shifter layer defects of a phase shifting mask can be repaired so that the equivalent shifter layer provides the same transmittance, phase shifting angle, and DOF as an original non-defective shifter layer. Also, the present invention does not require multiple masks or a mask with multiple phase shifting layers.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIG. 2A illustrates a missing shifter layer, and FIG. 2B illustrates a pin hole.

DETAILED DESCRIPTION OF THE INVENTION

Figure 1:
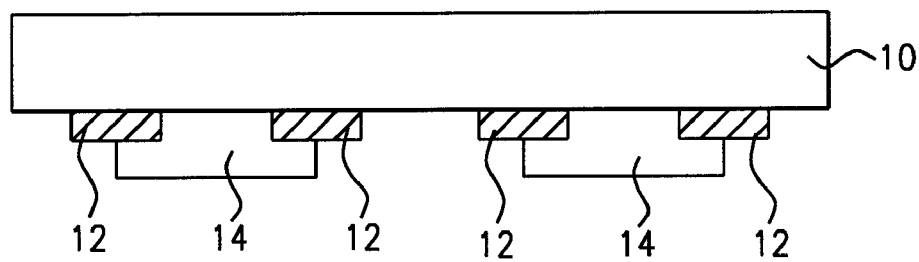
FIG. 1 is a sectional view of a typical line/space alternating phase shifting mask (ASPM).

The present invention will be described in detail with reference to the accompanying drawings. The present invention provides a method for repairing shifter layer defects in a phase shifting mask. While this invention is particularly suited to alternating phase shifting masks (APSM) such as contact alternating phase shifting masks and line/space alternating phase shifting masks (shown in FIG. 1), it can be applied to other phase shifting masks as well. A typical APSM comprises a quartz substrate (10) with opaque patterning (12) applied thereon. A phase shifting layer (14) can be applied to alternating openings between the opaque patterning.

Figure 2A:
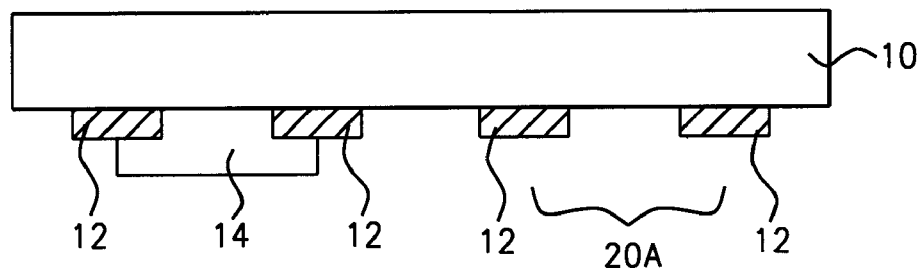
FIGS. 2A and 2B illustrate typical ASPM defects.
Figure 2B:
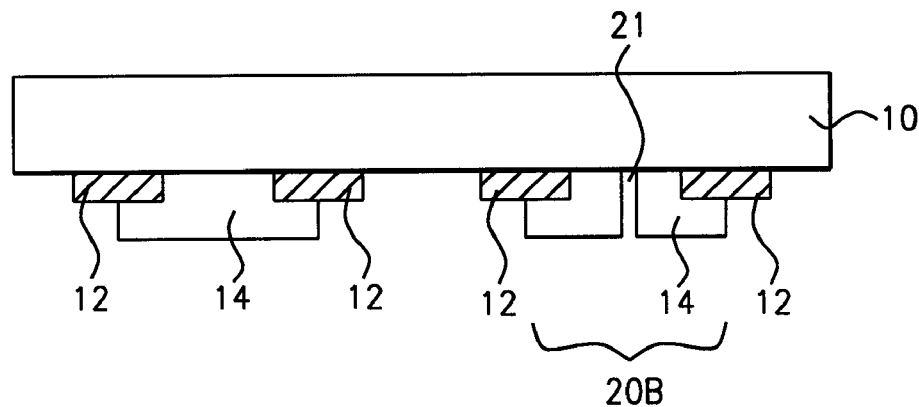

The preferred embodiment of the present invention begins when a shifter layer defect is detected during routine inspection of a phase shifting mask. The defect area (20) can be an area with a missing shifter layer (20A), as shown in FIG. 2A, or an area with a pinhole in a shifter layer (20B), as shown in FIG. 2B. A defective shifter is removed using, for example, a laser tool or etch (e.g., FIB).

The key to this invention is a novel two step process to form an equivalent shifter layer (30) with about the same light transmittance and phase angle shift as an original, non-defective shifter layer (14). For a DUV APSM, transmittance is typically about 6% and phase angle shift is about 180 degrees. The first step is to etch the quartz substrate in a focus ion beam repair machine, using $XeF_2$ gas, to cause a leading phase angle shift. The second step is to deposit an equivalent shifter layer in-situ in the focus ion beam repair machine, using a carbon based gas. When the equivalent shifter layer has about the same transmittance as the original shifter layer (e.g. 6%), the phase angle is lagging less than 180 degrees. The leading phase angle shift caused by etching the quartz substrate and the lagging phase angle caused by the equivalent shifter layer combine to produce a phase angle 180 degrees leading.

Etching the Oz Substate Using FIB with XeF2 Gas

Figure 3:
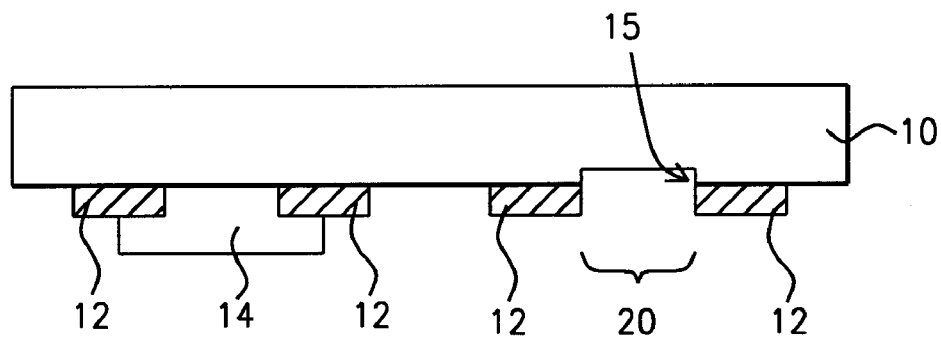
FIGS. 3 and 4 illustrate sequential sectional views of a process for repairing shifter layer defects in an APSM according to the present invention.

Referring to FIG. 3, in the first key step, the quartz substrate (10) is etched in the defect area (20) forming a trench (15) in the quartz substrate. The trench (15) is formed by etching the quartz substrate (10) in a focused ion beam (FIB) repair machine, such as the Micrion FIB repair machine, using a $XeF_2$ gas assisted etch process. The etch is preferably performed at a $XeF_2$ gas pressure of between about 1.4 torr and 1.8 torr, and at a FIB dosage of between about 0.12 nC/$\mu m^2$ and 0.16 nC/$\mu m^2$. Most preferably, the etch is performed at a pressure of between 0.155 torr and 0.165 torr, and at a FIB dosage of between 0.15 nC/$\mu m^2$ and 0.16 nC/$\mu m^2$. The etch time depends upon the area to be repaired.

Figure 5:
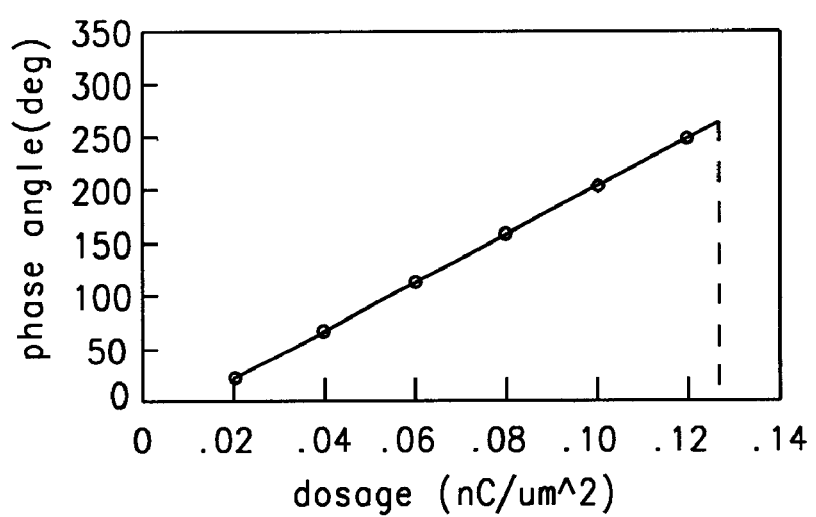
FIG. 5 illustrates the transmittance of an equivalent phase shifter layer as a function of focused ion beam dosage for equivalent phase shifter layer deposition.

As shown in FIG. 5, the $XeF_2$ quartz etch preferably provides a phase angle shift of about 67 degrees lagging. The FIB working mechanism allows the user to work the repair region with a reaction on the repair region only.

Depositing Equivalent Shifter Layer

Figure 4:
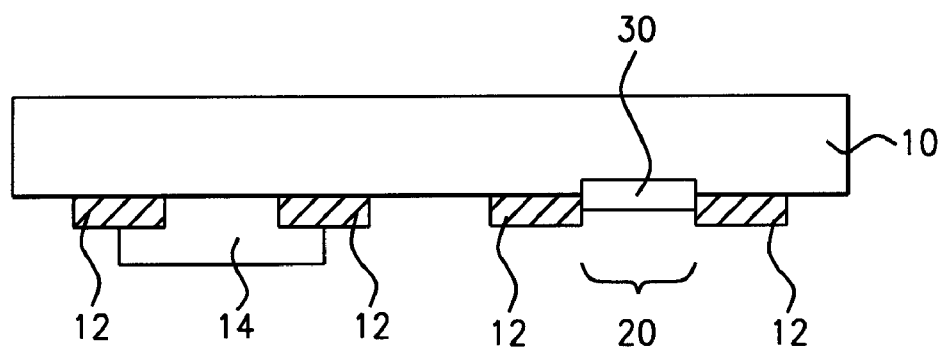

As shown in FIG. 4, following the etching of a trench (15) in the quartz substrate (10), an equivalent shifter layer (30) is formed in the defect area (20) using a carbon-based gas in a focused ion beam repair machine (e.g. Micrion FIB). The carbon-based gas is preferably styrene deposited at a pressure of between about 0.6 torr and 1 torr, at a focused ion beam dosage of between about 0.12 nC/$\mu$m$^2$ and 0.15 nC/$\mu$m$^2$. The deposition time is dependant on the area of the repair. Most preferably, styrene is deposited at a pressure of 0.8 torr, a dosage of 0.16 nC/$\mu$m$^2$.

Figure 6:
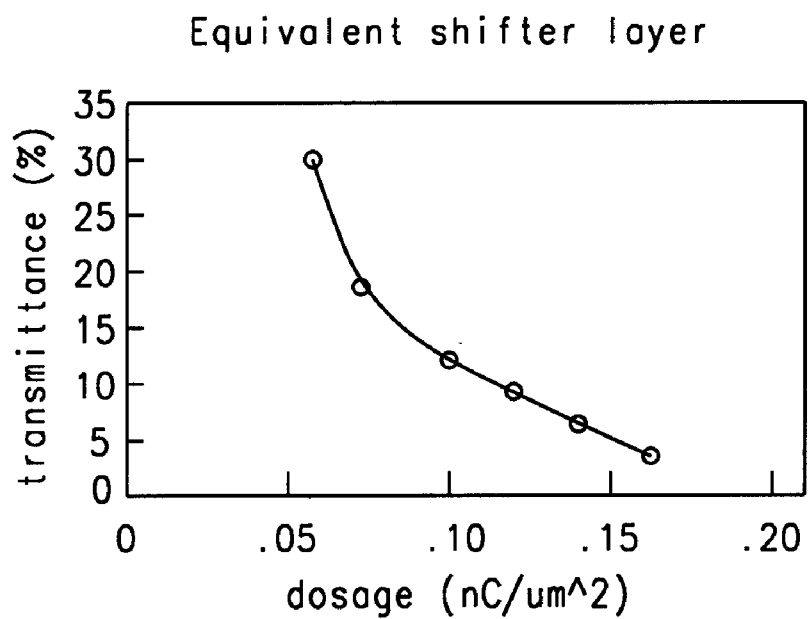
FIG. 6 illustrates the phase angle of an equivalent shifter layer as a function of focused ion beam dosage for equivalent phase shifter layer deposition.
Figure 7:
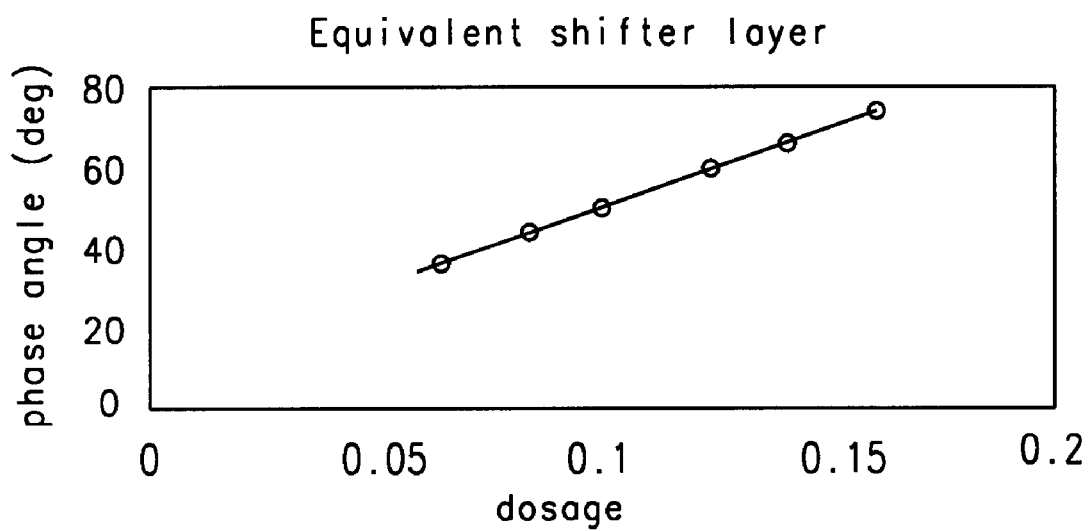
FIG. 7 illustrates the phase angle of the quartz substrate as a function of focused ion beam dosage for $XeF_2$ etch.

As shown in FIG. 6, the transmittance of the equivalent shifter layer is about 6% which is the same as an original DUV APSM shifter layer. As shown in FIG. 7, for a FIB dosage of 0.14 nC/$\mu$m$^2$, the equivalent shifter layer has a phase shifting angle of 67 degrees lagging. The net phase shifting angle of the etched quartz substrate and the equivalent shifter layer is 180 degrees. Therefore this invention provides an equivalent shifter layer with the same transmittance and the same phase shifting angle as an original non-defective shifter layer for a DUV APSM. Additionally, the depth of focus (DOF) for the equivalent shifter layer is about 0.6 $\mu$m which is the same as an original non-defective shifter layer for a DUV APSM.

The key advantages of the present invention are that shifter layer defects of a phase shifting mask can be repaired so that the equivalent shifter layer provides the same transmittance, phase shifting angle, and DOF as an original non-defective shifter layer. Also, the present invention does not require multiple masks or a mask with multiple phase shifting layers.

While the invention has been particularly shown and described with reference to the preferred embodiments thereof, it will be understood by those skilled in the art that various changes in form and details may be made without departing from the spirit and scope of the invention.

What is claimed is:

1. A method for repairing shifter layer defects in a phase shifting mask, comprising the steps of:
   a. etching a quartz substrate of a phase shifting mask in a defective shifter layer area in a focused ion beam repair machine to provide a leading phase shift angle; and
   b. depositing an equivalent shifter layer, using a focused ion beam and a carbon based gas; wherein the cumulative phase shift angle for the quartz etching and the equivalent shifter layer is about 180 degrees.

2. The method of claim 1 wherein said quartz substrate is etched using XeF$_2$ gas and a focused ion beam having a dosage of between about 0.12 nC/$\mu$m$^2$ and 0.16 nC/$\mu$m$^2$.

3. The method of claim 1 wherein said quartz substrate is etched using XeF2 gas and a focused ion beam having a dosage of about 0.15 nC/$\mu$m$^2$ and 0.16 nC/$\mu$m$^2$.

4. The method of claim 1 wherein said equivalent shifter layer comprises styrene deposited using a focused ion beam having a dosage of between about 0.12 nC/$\mu$m$^2$ and 0.16 nC/$\mu$m$^2$.

5. The method of claim 1 wherein said equivalent shifter layer comprises styrene deposited using a focused ion beam having a dosage of between about 0.13 nC/nC/$\mu$m$^2$ and 15 nC/$\mu$m$^2$.

6. The method of claim 1 wherein said phase shifter mask is a line/space alternating phase shifting mask.

7. The method of claim 1 wherein said phase shifting mask is a contact alternating phase shifting mask.

8. A method for repairing an alternating phase shifting mask with a missing shifter layer, comprising the steps of:
   a. etching a trench in a quartz substrate of the alternating phase shifting mask in a defective shifter layer area using XeF$_2$ gas in a focused ion beam repair machine with a focused ion beam dosage between about 0.12 nC/$\mu$m$^2$ and 0.16 nC/$\mu$m$^2$ to provide a leading phase shift angle; and
   b. depositing an equivalent shifter layer, using a focused ion beam and styrene gas; wherein the transmittance of the equivalent shifter layer is about 6% and the phase shift angle is lagging such that the cumulative phase shift angle for the quartz etching and the equivalent shifter layer is about 180 degrees.

9. The method of claim 8 wherein said trench in said quartz substrate is etched using XeF$_2$ gas and a focused ion beam dosage of between about 0.15 nC/$\mu$m$^2$ and 0.16 nC/$\mu$m$^2$.

10. The method of claim 8 wherein said shifter layer comprises styrene deposited using a focused ion beam dosage of between about 0.13 nC/$\mu$m$^2$ and 0.15 nC/$\mu$m$^2$.

11. The method of claim 8 wherein said alternating phase shifting mask is a line/space alternating phase shifting mask.

12. A method for repairing an alternating phase shifting mask with a pin hole defect in a defect area of a shifter layer, comprising the steps of:
   a. removing the shifter layer from the defect area;
   b. etching a trench in a quartz substrate of the alternating phase shifting mask in a defective shifter layer area using XeF$_2$ gas in a focused ion beam repair machine with a focused ion beam dosage between about 0.12 nC/$\mu$m$^2$ and 0.16 nC/$\mu$m$^2$ to provide a leading phase shift angle; and
   c. depositing an equivalent shifter layer, using a focused ion beam and styrene gas; wherein the transmittance of the equivalent shifter layer is about 6% and the phase shift angle is lagging such that the cumulative phase shift angle for the quartz etching and the equivalent shifter layer is about 180 degrees.

13. The method of claim 12 wherein said trench8 in said quartz substrate is etched using XeF$_2$ gas and a focused ion beam dosage of about 0.14 nC/$\mu$m$^2$.

14. The method of claim 13 wherein said shifter layer comprises styrene deposited using a focused ion beam dosage of about 0.14 nC/$\mu$m$^2$.

15. The method of claim 12 wherein said alternating phase shifting mask is a line/space alternating phase shifting mask.

* * * * *